Feb. 10, 1970 J. F. COLLINS ET AL 3,495,134

ROTA-PAK SYSTEM CONCEPT

Filed May 16, 1968 4 Sheets-Sheet 1

INVENTORS
JOHN F. COLLINS
HOWARD T. JOHNSTON, JR.
RICHARD M. SMITH
FRANCIS X. WALSH, JR.

BY Harold H. Sweeney Jr.
ATTORNEY

FIG. 2
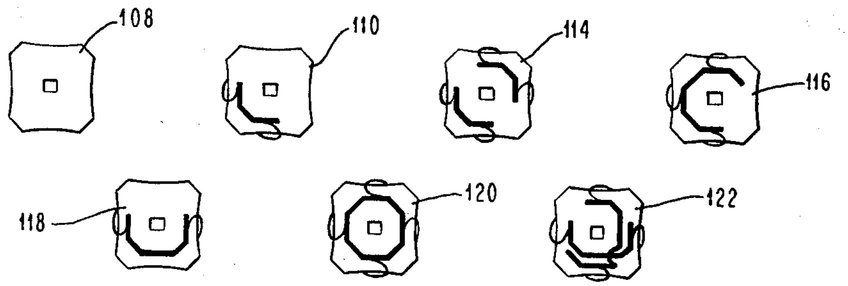
FIG. 3
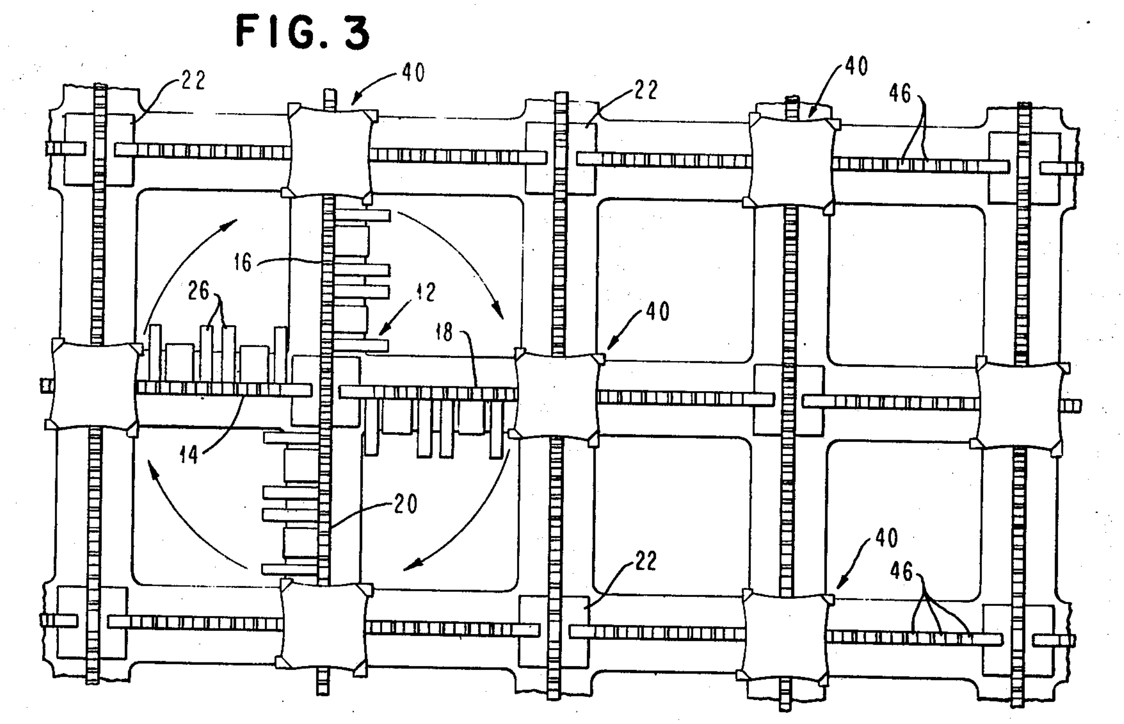
FIG. 5
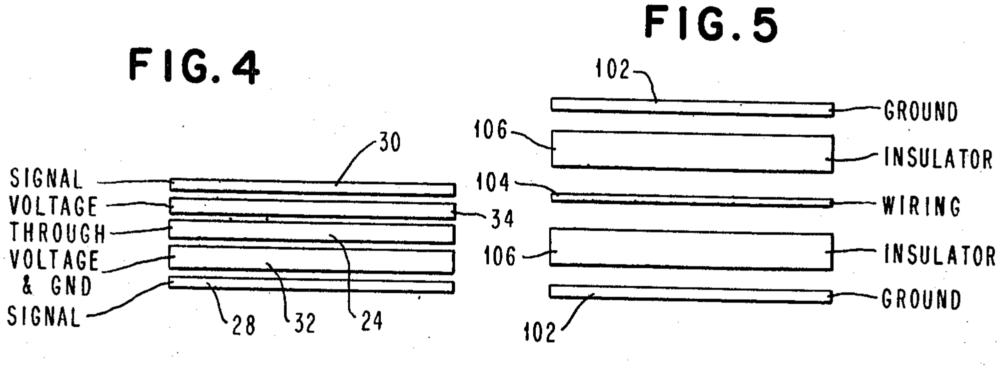
FIG. 4, FIG. 5

Feb. 10, 1970 J. F. COLLINS ET AL 3,495,134

ROTA-PAK SYSTEM CONCEPT

Filed May 16, 1968 4 Sheets-Sheet 3

ROTA-PAK SYSTEM CONCEPT

Filed May 16, 1968 4 Sheets-Sheet 4

United States Patent Office 3,495,134
Patented Feb. 10, 1970

3,495,134
ROTA-PAK SYSTEM CONCEPT

John F. Collins, Wappingers Falls, Howard T. Johnston, Jr., and Richard M. Smith, Poughkeepsie, and Francis X. Walsh, Jr., Wappingers Falls, N.Y., assignors to International Business Machines Corporation, Armonk, N.Y., a corporation of New York Filed May 16, 1968, Ser. No. 729,684
Int. Cl. H02f *1/00, 1/04, 9/00*
U.S. Cl. 317—101 12 Claims

ABSTRACT OF THE DISCLOSURE

An electronic packaging assembly is provided having a plurality of electronic component carrying units each of which has a hub and four radially extending circuit boards which make a 90° angle at the hub with adjacent circuit boards. Edge contacts are located along the outer edge of each radially extending circuit board. Electronic circuitry connects the edge contacts with the electronic components on the respective boards. The electronic component carrying units are pivotally mounted at alternate crossover points on a base having a grid structure and having power conducting means integrally formed therein. These electronic component carrying units are interconnected by vertical columns of wafers extending from the grid base at the crossover points between the pivot crossover points. The wafers each have a predetermined circuit connected between edge contacts thereon for connecting to the edge contacts of adjacent radial extending circuit boards.

This invention relates to an electronic assembly, and more particularly to a high density packaging structure for electronic components which utilizes a minimum of space consistent with accessibility, improves the efficiency of air cooling and simplifies wiring interconnection changes.

U.S. Patent 3,196,318 sets forth a high density electronic package which includes plastic blocks each having octagonal shaped openings in which spoke carrying hub elements called "windmills" are inserted by sliding therein along grooves. The windmills carry electronic components which are connected to output contacts by a wire mesh adjacent one or more faces of the plastic block. The windmill units are also interconnected by means of printed wiring on the plastic blocks and on the edges of the windmills. It will be appreciated that the plastic block structure or equivalent prior art structures limit the packaging density and interfere with the cooling of the components. Also, these prior art structures do not provide an easily changeable circuit interconnecting means between the various component carriers such as the windmills.

The present invention provides a packaging assembly which leaves the components carried by the radially extending component carrying units substantially unobstructed by any additional structure so that they are open to the cooling air except for narrow upright columns which interconnect radially extending parts of different units.

The upright columns contain wafers having circuits thereon for making electrical interconnections between the outer radial ends of the component carrying boards of the carrying unit. The wafers are readily interchangeable or replaceable with wafers having a different circuit configuration, thereby providing a different interconnection between the component carrying boards of different carrying units.

The component carrying units of the present invention are pivotally mounted on a grid base structure which is laid out in a grid arrangement and which has the power busses integrally formed therein for connection to the component carrying units so that no cabling or other external power transmission means need be utilized. Connections between the component carrying units and the communications columns as well as the power busses is made by a wiping action produced as a result of turning the component carrying unit about its pivot.

It is a primary object of the present invention to provide an improved assembly for packaging electronic components in which the component carrying units form the housing structure.

Another object of the present invention is to provide a high density electronic component packaging assembly in which the efficiency of air cooling is improved.

It is a further object of the present invention to provide an electronic component packaging assembly in which circuit interconnection changes between different circuit boards throughout the assembly can be easily made.

It is a further object of the present invention to provide a high density electronic component packaging assembly in which the power bussing forms an integral part of the overall assembly thereby eliminating the need of cabling.

Another object of the present invention is to provide a high density electronic component packaging assembly in which the power and electrical connections between units are made by a wiping action at the contacts.

Briefly, the invention consists of an assembly for high density packaging of electronic components having a plurality of electronic component carrying units each having a hub and four radially extending circuit cards which substantially make a 90° angle at the hub with adjacent circuit cards. The electronic components are connected to edge contacts on the outer radial edge of the respective circuit board. The circuit boards are electrically connected to a power conducting means integrally formed in a power base member having a grid structure. The electronic component carrying units are mounted at alternate crossover points in the grid structure of the base member. A communications column is located at each of the other crossover points in the grid structure of the base member which provides electrical interconnections between the circuit cards extending toward each communication column from the various electronic component carrying units located on the adjacent mounting means.

The foregoing and other objects, features and advantages of the invention will be apparent from the following more particular description of a preferred embodiment of the invention, as illustrated in the accompanying drawings.

FIG. 1 is a schematic exploded view showing the component carrying unit, the base member and the intercommunications column.

FIG. 2 is a horizontal sectional view of the wafers of the communications column taken along the line 2—2 of FIG. 1 showing all the possible circuit arrangements thereon.

FIG. 3 is a schematic plan view of the assembly showing the interrelation of the component carrying units and the communications columns.

FIG. 5 is a cross sectional edge view of one of the communications column wafers taken along the line 5—5 of FIG. 1 showing the laminated structure thereof.

Figure 4:
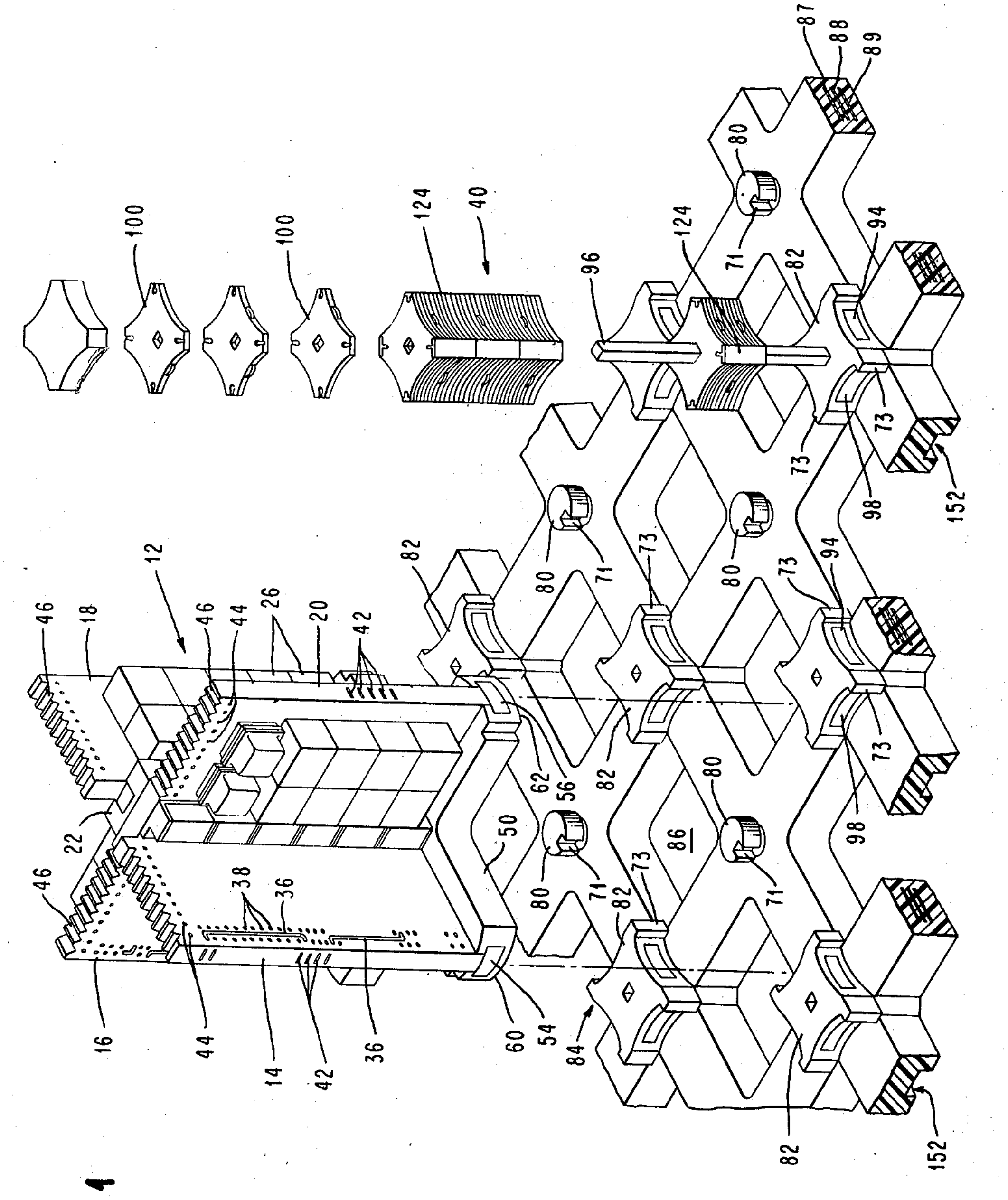
FIG. 4 is a schematic horizontal cross sectional view taken along the line 4—4 of FIG. 1 showing the various laminations in the cards of the component carrying units.

Referring to FIG. 1, there is shown a component carrying unit which has four circuit card portions 14, 16, 18, 20 which radially extend from a central hub 22. Each of the circuit card portions 14, 16, 18, 20 make an angle of 90° with the adjacent card portions thus forming a cross card arrangement. The circuit cards are generally of the well known laminated construction wherein the circuits may be applied by known printed circuit techniques. The cross section of a card showing the various laminae can be seen in FIG. 4. The through plane 24, shown as the middle laminae, is generally utilized to make connections from the edge of the card through the card to the opposite edge without making any connections to components caried thereon. The electronic components 26, in module form, are attached to the card and the various circuit connections are made to other modules 26 or to edge contacts 42 of the card by circuits (not shown) along the front signal plane 28 to which the modules 26 are attached. The planes intermediate the through plane 24 and the front and back signal planes 28, 30 are the voltage and ground and voltage signal planes 32, 34, respectively. The back signal plane or laminae 30, that is, the plane which is opposite that of the plane 28 to which the modules 26 are attached is utilized for making engineering corrections to the card wiring. The engineering corrections wiring referred to can be seen along the back edge of the leftmost card 14 n FIG. 1. These wiring corrections may be made by using premade connectors 36 which have an adhesive on the back thereof and which are solderable to connection points 38 provided for engineering corrections along the back of each of the cards 14, 16, 18, 20.

In order to make connections to the communications columns 40 and, thus, to other component carrying units 12 in the assembly, edge connectors 42 are utilized along the vertical outer edges of each of the cards 14, 16, 18, 20. Along the top of each of the radially extending cards 14, 16, 18, 20, there are spaced probe points 44 by means of which various test connections can be made to the cards. A special long probe test tool 134, shown in FIGS. 9 and 10, has been designed to be utilized with the cards. The tool has probe contacts thereon adapted to contact the probe points 44 when it is correctly indexed with the grooves 46 of the respective card. It should be noted that the pairs of cards 14, 18 and 16, 20 are of different heights. This is to prevent interference of probe tools if they are simultaneously used on cards of the same component carrying unit 12. The probe unit will be described in more detail in connection with FIGS. 9 and 10.

Figure 8:
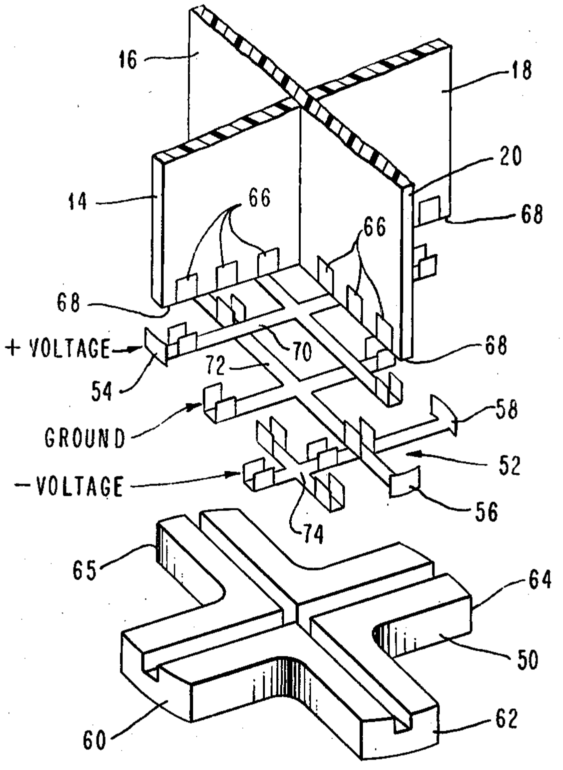
FIG. 8 is a schematic exploded view of the power distribution means in the component carrying unit.

Each of the cards 14, 16, 18, 20 are supported in a card base 50 which, as seen in FIG. 8, contains a ground and voltage distribution arrangement 52 which connects the power obtained at the outer radial ends 60, 62, 64, 65 of the card base 50 to contacts 66 on the bottom edge 68 of the cards. This distribution arrangement 52 consists of a plus voltage, ground and minus voltage bus bar 70, 72, 74. It should be noted that each of the voltage bus bars 70, 72, 74 has an upstanding tab 54, 56, 58 at one of the outer ends. The plus voltage bus bar 70 has the tab 54 at the left end while the ground bar 72 has upstanding tabs 56 at both ends and the minus voltage bus bar 74 has the tab 58 at the right end. It can be seen, that when the exploded view of FIG. 8 is assembled, each of the ends 60, 62, 64, 65 of the card base 50 has a tab or contact 54, 56, 58, 56 respectively, for receiving the particular voltage mentioned. Each card base member 50 has a centrally located opening therein (not shown) which fits on a pivot 80 shown in FIG. 1, to locate component carrying units 12 and to allow them to be turned so that they can wipe into contact with adjacent power bus posts 82 and communication columns 40. A wide range of voltages can be distributed in this system by increasing the number of busses and contacts. The centrally located opening in each card base 50 contains a key which when fitted into the slot 71 in the pivot 80 insures the correct orientation of the component carrying unit 12 with respect to the adjacent communications columns 40. Once the key passes completely thru the slot 71, the component carrying unit 12 can be pivoted so that wiping connections can be made between the correct card and communications column 40. It should be noted, that stops 73 are located on the power base posts 82 which prevent the component carrying units 12 from being turned about their pivot 80 the wrong way. These stops 73 also prevent the cards of the component carrying unit 12 from passing the communications column 40 to which it is to make connections. FIG. 3 shows, in a schematic plan view, the component carrying unit 12 and the direction in which it is rotated, shown by arrows, so that the outer radial edges of the cards 14, 16, 18, 20 contact the respective column 40 as shown. The alternate placement of the columns 40 and the component carrying units 12 is also shown. The cards 14, 16, 18, 20 form the walls of closed squares forming a chimney through which air can be forced to give cooling by convection. It will be appreciated, that the electronic components 26 are very closely packed in this grid structure and that the maximum utilization is made of the available space since no housing structure exists between the cards of the carrying units 12.

The grid structure of the base member 84 provides openings 86 therein which correspond with the chimneys defined by the cards 14, 16, 18, 20 when in place. Thus, the air sweeps up from a fan 83 from below the base member 84 through the grid structure openings 86 and the chimneys formed by the cards 14, 16, 18, 20 of the component carrying units 12. At the cross points of the base member 84 alternating with the pivot cross points, there are located power bus connector means or base posts 82 at which electrical connections to the card base contacts 54, 56, 58, previously mentioned, are made. As can be seen from FIG. 1, each of these power connection means or posts 82 has four sides providing a connection to a card of four different component carrying units 12. These four power bus bar contacts 54, 56, 58 are arranged so that a pair of opposite contacts 56 on a pole are at ground potential, one side contact 58 is at a minus potential and the other side contact 54 is at a positive potential. Since each card 14, 16, 18, 20 of a component carrying unit 12 contacts the facing contact of a different post 82, the plus, minus and ground voltages are received at the ends of the card base 50 as shown in FIG. 1.

Figure 6:
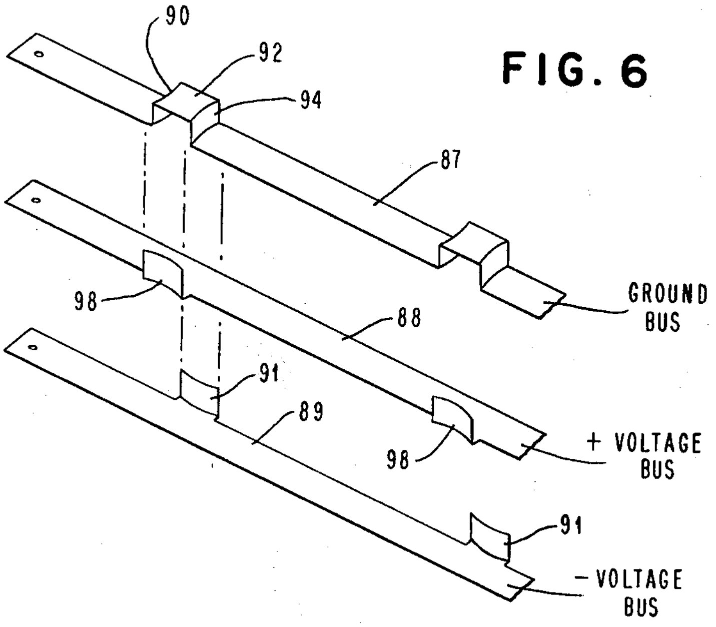
FIG. 6 is a schematic exploded view of the power bus bars located within the base member.
Figure 7:
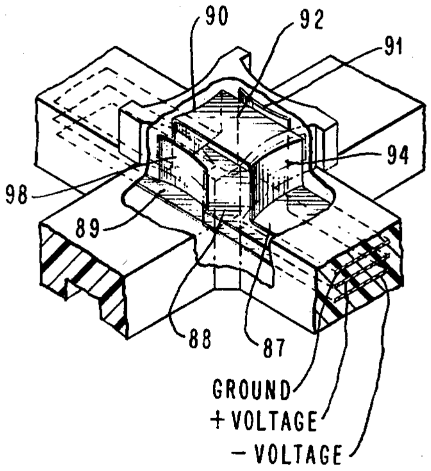
FIG. 7 is a perspective schematic diagram partly broken away showing the bus bars of the base member and the power contacts for connection to the component carrying units.

The voltage bus bars 87, 88, 89 form an integral part of the base member 84. Referring to FIG. 7, the ground, plus, and minus voltage bus bars 87, 88, 89 are shown in position in the base member 84. In FIG. 6, the voltage bus bars 87, 88, 89 are shown in exploded view. It should be noted, that the top bus bar 87 has three possible faces 90, 92, 94 which are at ground potential. The two oppositely facing surfaces 90, 94 form the opposite ground connectors on the base power posts 82, while the third or upward facing surface 92 forms a contact to which the center post 96 of the communications column 40 can be attached so that it can serve as a ground post. The plus voltage bus 88 has upward extending tabs 98 on the left side which form the contacts on the lefthand side of each column base post 82. Likewise, the minus voltage bus 89 provides the contact 91 on the righthand side of each column base post 82. Thus, each of the connecting points on the column base post 82 has a different voltage value applied thereto except of course for the ground contacts. Obviously, each of the busses 87, 88, 89 is electrically isolated from the others. If one or more component carrying units 12 require a special voltage, a bus providing this voltage could be designed into the base member 82 to replace one of the two ground contacts previously mentioned.

Extending vertically upward from the middle of each column base 82 is the ground or center post 96 upon which is located the path selection wafers 100, as shown in FIG. 1. These wafers 100, when in place on the ground post 96, form a communications column 40 which, as previously mentioned, interconnects a card from each adjacent component carrying unit 12. The arrangement of the communications columns 40 with respect to the component carrying units 12 can best be seen in FIG. 3 where one of the card portions from four different component carrying units 12 can be electrically interconnected through a communications column 40. The wafers 100 forming the communications columns 40 are replaceable with wafers having different circuit interconnections. That is, any wafer 100 can be removed and a different wafer substituted therefor. The wafers 100 can also be turned over or can be rotated to different positions with respect to the ground post 96 to give different circuit paths. A cross section schematic view of one of the wafers 100 is shown in FIG. 5 where the outer layers 102 are identified as ground layers or laminations separated from the inner conductor 104 by insulative layers 106. Thus, the wafer 100 is a coaxial conductor. Horizontal sectional views of the wafers 100 are shown in FIG. 2 illustrating the electrical paths that can be obtained with the wafers. Seven different wafers are shown which represent all of the possible communications paths that can be made between the four contacting card portions. The upper left wafer 108 is shown blank, that is, this is a wafer in which no communications can be made from card to card. The next wafer 110 shows a connection from one of the cards to an adjacent card and is known as a two-way connection. The next wafer 114 shows a connection which is known as a double two-way connection since it connects cards of two pairs together. The last wafer 116 in the top row is known as a three-way wafer. The leftmost wafer 118 in the bottom row is a two-way wafer connecting the opposite two cards. The middle wafer 120 in the bottom row shows a four-way wafer in which all four cards are connected together. The last wafer 122 in the bottom row is a crossover wafer in which opposite cards are connected to each other. It will be appreciated, that other connection arrangements can be utilized by increasing the number of contact points per side of the wafer. One of the important features of the communications column 40 is that the wafers 100 can be easily changed in the field merely by replacing a wafer with another wafer providing a different interconnection between card units. The various wafers can be coded, for instance by color, to indicate the particular interconnection type of wafer. It will be appreciated, that the communications column 40 can very easily be returned to its original connection scheme, in case the changes do not satisfactorily correct the system, by reinserting the original wafers. The wafers 100 in a communications column 40 can be automatically stacked under the control of a program. Also, the wafers can be held together in groups by means of a shroud 124, as shown in FIG. 1, or other means so that the wafers can be easily removed in groups. The shroud 124 can be a simple plastic holder or clip-on unit which is adapted to hold a predetermined number of wafers in place as a unit. For example, suppose that wafer 12 is to be replaced and that the wafers are grouped in groups of ten, the first group of ten can be removed as a unit and then two of the wafers of the next group removed to obtain the twelfth wafer.

Figure 9:
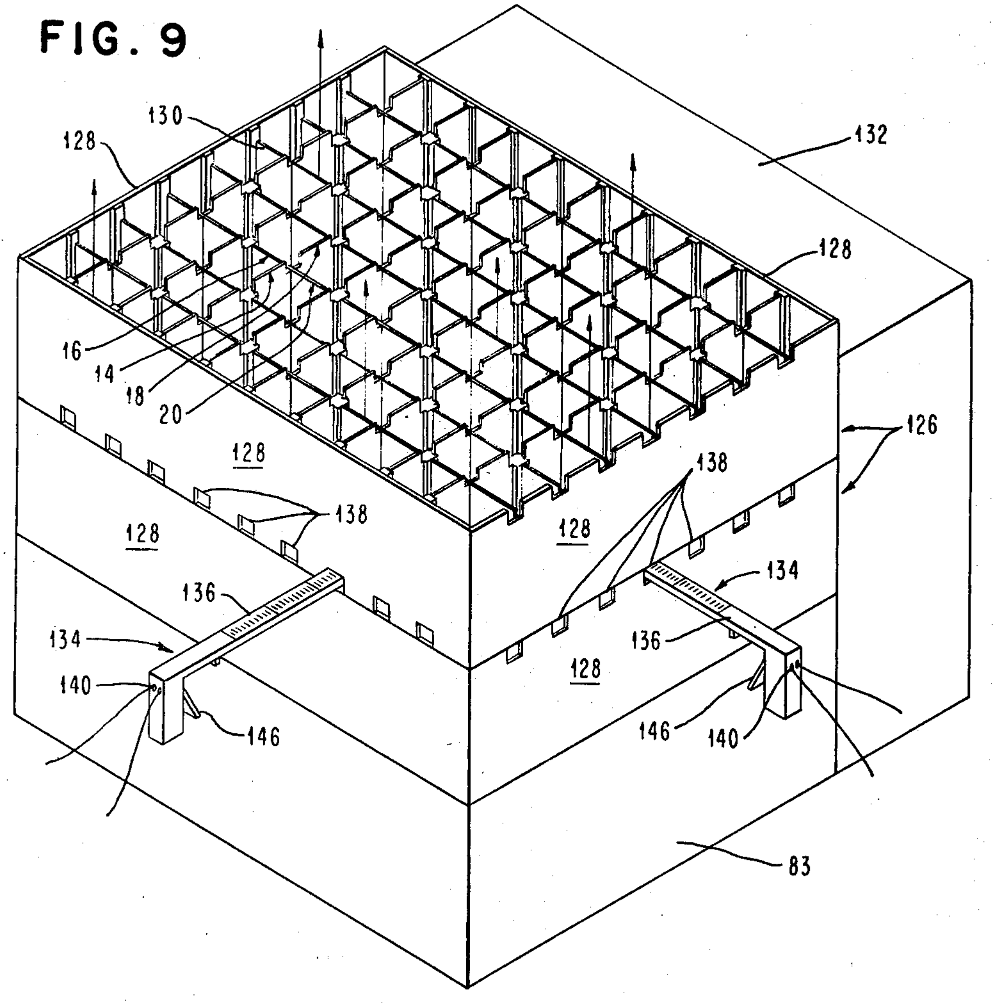
FIG. 9 is a schematic diagram illustrating stacked trays of units shown in FIGS. 1 and 3 and showing test probes utilized therewith.

Referring to FIG. 9, it can be seen that the electronic component carrying assemblies 126 are arranged in tray form for stacking. Each tray 126 consists of four side panels 128. Within each tray are a plurality of electronic component carrying units 12, each pivotally mounted at a crossover point on a grid base structure. The tray side panels 128 are adapted for carrying printed circuitry on the inner side thereof to provide an input and output means as well as a connecting means between electronic component carrying units 12. Special single card units 130 have been designed to connect between the tray sides 128 and the adjacent communications columns 40. As can be seen from FIG. 9, the trays 126 can be stacked one upon another. A blower 83 is located at one of the open ends thereof to provide the forced air convection as indicated thereon by arrows. The voltage regulator 132 is shown at one of the sides 128 thereof completing the unit. These completed units can likewise be stacked or fitted together to form a larger unit of the desired capacity.

Special probes 134 have been designed for testing or troubleshooting the various electronic component carrying units 12 in each tray 126. The probes 134 consist of an elongated portion 136 capable of fitting into slots 138 in the tray sides 128 and passing along the top edges of the cards 14, 18 or 16, 20 of the component carrying units 12 aligned with the slots. As previously mentioned in connection with FIG. 1, the cards 14, 16, 18, 20 of the component carrying units 12 contain probe or test points 44 adjacent the upper edge thereof. The probe connections 140 on the outer end thereof and a conductor 142 extending from each probe connection 140 to a respective one of a pair of movable probe contacts 144 (see FIG. 10). The conductors are in the form of coaxial cables embedded in the elongated portion 136 of the probe 134. The probe 134 has a trigger mechanism 146 arranged on the outer end by means of which the probe contacts 144 can be moved so as to fit into or contact the test points 44. Once the probe contacts 144 are in position, the signal obtained at the test points 44 is conducted thru the probe contacts 144 along the coaxial cable 142 to the monitoring equipment (not shown) attached to the probe connections 140 at the outer end of the probe 134.

Figure 10:
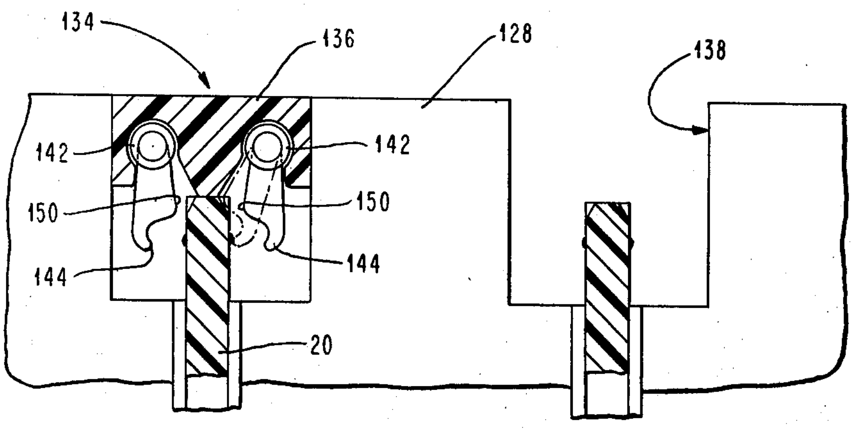
FIG. 10 is a cross sectional view looking inward at the end of the probe just before the movable probe contacts.

Referring to the end view of the probe unit in FIG. 10, it will be appreciated that the probe contacts have a special guiding edge 150 which is adapted to contact the sloping sides of the grooves 46 on the top edges of the cards 14, 16, 18, 20 when the probe contacts 144 are constrained to move inward to make contact with the test points 44. These guiding edges 150 tend to slide down the sloped sides of the grooves 46 as the probe contacts 144 tend to move toward each other thereby positioning the probe 134 so that the probe contacts 144 will contact the test points 44 on the cards. It will be noted that the test points 44 are adjacent the very bottom of the grooves 46. The probe is positioned, so as to have the probe contacts in the correct groove, by means of calibrations along the top surface of the elongated portion 136 of the probe 134. The probe 134 is inserted the desired distance by aligning the correct calibration with the opening 138 in the side panel 128. The fine adjustment, if necessary, is automatically obtained by the camming action of the special edge 150 on the probe contact 144 with the sloped groove side when the contacts are caused to move together.

As was previously noted in connection with FIG. 1, one set of opposite cards 16, 20 are shorter than the other opposite card set 14, 18 of a component carrying unit 12. Also, the base member 84 has channels 152 along its bottom side which correspond to the top edges of the tallest cards 14, 18. These channels are of sufficient size to accommodate the elongated portion 136 of the probe 134. Thus, when the trays 126 are stacked, as shown in FIG. 9, the tray side panels 128 have openings 138 therein which correspond on the left panel to the channels 152 in the bottom of the grid base member 84 and in the righthand panel to the space left above the top edge of the shorter cards 16, 20 in the component carrying units 12.

The electronic component carrying units 12 of the present arrangement are not limited to carrying modules 26 but may have various constructions such as a local storage facility including the associated logic therewith. Also, for example, an active filter, power regulator, and discrete electrical components could be included on one or more of the cross card units.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. An assembly for high density packaging of electronic components comprising:

- a plurality of electronic component carrying units each having a hub and four radially extending circuit cards which substantially make a 90° angle at the hub with adjacent circuit cards;
- edge contacts located along the outer edge of each of said radially extending circuit cards;
- circuit means for connecting said electronic components to respective edge contacts and for interconnecting preselected edge contacts;
- a power base member having a grid structure and having power conducting means integrally formed therein;
- means for making electrical connections from said circuit cards to said power conducting means of said power base member;
- mounting means located at alternate cross points in said grid structure of said base member for mounting of said electronic component carrying units;
- a plurality of communications columns each extending vertically from the same side of said power base member as said electronic component carrying units and at crossover points alternate with said mounting means in said grid structure;
- electrical interconnecting means on said columns for making predetermined electrical connections between edge contacts on the circuit cards extending toward said communications column from the different electronic component carrying units located on the adjacent mounting means.

2. An assembly according to claim 1, wherein said mounting means is a pivot about which said electronic component carrying unit can rotate so as to provide a wiping action between electrical contacts on said component carrying unit with said communications column and with said power conducting means of said power base member.

3. An assembly according to claim 2, wherein each of said communications columns comprises a center post and a plurality of wafers adapted to be stacked on said center post, said wafers being shaped to make simultaneous contact with a respective contact on each of said circuit cards extending toward said stack of wafers from different electronic components carrying units located on adjacent mounting means, said wafers including wafers having contact means on the edges thereof and circuit means interconnecting said contact means, the contact means and interconnecting circuit means are of different combinations on different wafers to provide at least one wafer capable of making a corresponding one of the possible combinations of electrical interconnections between the cards extending towards said stack of wafers from adjacent component carrying units.

4. An assembly according to claim 3, wherein said wafers have a substantially square shape with the sides thereof having an equivalent inward curvature the radius of which is equivalent to the radius determined by the outside edge of the cards of the electronic component carrying units when it is rotated about said pivot.

5. An assembly according to claim 1, wherein said radially extending circuit cards are laminated each having an outer signal layer on each side, a voltage layer adjacent the inside of both signal layers and a central through connection layer.

6. An assembly according to claim 5, wherein the outer signal layer on the opposite side of each of said circuit cards from the component carrying side is adapted for making circuit changes on said card.

7. An assembly according to claim 1, wherein said means for making electrical connections from said circuit cards to said power conducting means of said power base member includes a card base member connected to and coextensive with the bottom edges of said radially extending circuit cards, said card base member containing voltage bus bars, said circuit cards having contacts along the bottom edges thereof connected to said voltage bus bars to obtain the respective voltages therefrom, said bus bars providing a contact means at the outer radial end of said card base member for connection to said power distribution means of said power base member.

8. An assembly according to claim 7, wherein said power conducting means in said power base member comprises power bus bars, said power base member including column post bases each located at a crossover point adjacent a pivot point in the grid structure of the power base member, said power bus bars forming four contacts at each of said column post bases, each contact facing a different pivot point, each of said contacts on a power base member being electrically connected to an outer radial contact of a card base member of a different adjacent component carrying unit.

9. An assembly according to claim 3, wherein each of said electrical interconnecting means between circuit cards of component carrying units common to a column of wafers can be changed by substituting a wafer of a different contact and circuit configuration for the respective wafer in the column, the electrical interconnecting means can also be changed by inverting a wafer and by rotating a wafer to a new position.

10. An assembly according to claim 1, wherein four side panels are provided enclosing the sides of an assembly, said side panels having electric circuits thereon interconnecting predetermined electronic component carrying units and serving as input-output means for said assembly, said side panels providing stacking means so that assemblies can be stacked with the power base members parallel to one another and with the circuit cards directly over one another so that air passages formed by the circuit cards are vertical and continuous.

11. An assembly according to claim 10, wherein one set of opposite radially extending circuit cards is of a greater height than the other set of opposite radially extending circuit cards oriented at 90° with respect to said first set on each electronic component carrying unit, the power base member having an elongated channel in the bottom thereof which extends across the assembly directly above the aligned sets of cards having the greater height when the assemblies are stacked thereby forming a passage across the assembly, one side panel on an assembly having openings therein at the end of said passages, an adjacent side panel having openings therein immediately above the shorter set of cards, each of said cards contain evenly spaced parallel grooves extending across the top edge and a plurality of test points located adjacent the top edge of each of said cards, each of said test points being adjacent the bottom of one of said grooves.

12. An assembly according to claim 11, wherein test means are provided comprising a probe having an elongated portion adapted to fit through the openings in said side panels and into the passages above said cards, calibration means located along a surface of said elongated portion of said probe means adapted to be indexed with the opening in the panel to determine the position along the passage of the elongated portion of the probe means, contact means located at the inner end of said elongated portion of said probe means and adapted to be moved so as to contact the sides of the groove thereby moving the probe so that the contact means will contact said test point adjacent the bottom of the groove.

References Cited

UNITED STATES PATENTS

| | | | |
|---|---|---|---|
| 3,070,729 | 12/1962 | Heidler | 317—100 |
| 3,139,559 | 6/1964 | Heidler | 317—100 |
| 3,259,807 | 7/1966 | Drugan et al. | |

ROBERT K. SCHAEFER, Primary Examiner

D. SMITH, Jr., Assistant Examiner

U.S. Cl. X.R.

317—100